United States Patent [19]

Bradford

[11] 4,439,861

[45] Mar. 27, 1984

[54] SOLID STATE LASER WITH CONTROLLED OPTICAL PUMPING

[75] Inventor: James N. Bradford, Fairfax County, Va.

[73] Assignee: MRJ, Inc., Fairfax, Va.

[21] Appl. No.: 291,191

[22] Filed: Aug. 7, 1981

[51] Int. Cl.³ .............................................. H01S 3/10
[52] U.S. Cl. ...................................... 372/25; 372/30; 372/75; 372/70
[58] Field of Search ....................... 372/69, 31, 70, 29, 372/76, 101, 72, 87, 75, 25, 30

[56] References Cited

U.S. PATENT DOCUMENTS

| 3,624,545 | 11/1971 | Ross | 372/75 |
| 3,663,892 | 5/1972 | Ostermayer, Jr. | 372/75 |
| 4,348,648 | 9/1982 | Childs | 372/29 |

Primary Examiner—William L. Sikes
Assistant Examiner—Léon Scott, Jr.
Attorney, Agent, or Firm—John E. Benoit

[57] ABSTRACT

A laser apparatus employing a solid state lasing element pumped by a controlled pump providing pump power of adjustable amplitude, constant over the controllable duration of pumping. The laser apparatus thus embodied providing the means for producing and amplifying laser pulses of coherent radiation having generally rectangular pulse shape.

11 Claims, 16 Drawing Figures

SOLID STATE LASER WITH CONTROLLED OPTICAL PUMPING

BACKGROUND OF THE INVENTION

The present invention relates generally to laser devices and more particularly to an improved solid state laser for producing pulsed laser signals of good fidelity and controlled duration and power.

Previously, laser oscillators employing optical pumping have been operated in one of two modes: continuous (cw) or pulse. Inherently, optically pumped cw laser oscillators produce low output power. Therefore, the use of a shutter or other means to extract a laser pulse from a cw laser produces only a low power pulse. Pulsed optically pumped laser oscillators have previously taken two basic forms: the so-called normal-mode laser, in which oscillation grows spontaneously during optical pumping and then terminates before the pumping pulse is completed; and the so-called Q-switched mode, in which oscillation, having been suppressed during a large part of the pumping pulse, grows very rapidly, after switching, to a high power for a small fraction of the total pumping time and then rapidly decays. Although adjustment of pump power can influence emitted power and pulse duration in a somewhat predicted way, neither power distribution during the emission time nor the pulse duration can be accurately controlled in either mode.

Optically pumped laser amplifiers have generally functioned primarily as energy amplifiers and, as such, have previously been operated in such a way as to saturate the gain. That is to say, amplification of the early part of a pulse depletes the energy stored by optical pumping so that later parts of the pulse are amplified less; the trailing edge of the pulse, in general, is not amplified at all. Saturation of the gain makes preservation of the pulse shape difficult, if not impossible. At the same time, to achieve high pulse-energy efficiency, the small signal gain must be made large. This means that spontaneous photons may be amplified, causing still further distortion. In some situations, spurious oscillations will occur, severely depleting the population inversion.

There has long existed the need for a laser in which both the duration of the emitted pulse and its power level can be accurately controlled. This need exists, for example, in certain illumination devices, in applications requiring fixed rates of energy transfer (e.g., medical applications) and in communications systems, to name a few. The satisfaction of this need would require laser oscillators that produce well shaped, generally rectangular pulses of controlled power, and amplifiers that provide both gain and fidelity.

STATEMENT OF PRIOR ART

U.S. Pat. No. 3,178,657 issued on Apr. 13, 1965 to Morse teaches the use of a single optical pump source in the form of a flash tube to produce a repetitive set of subthreshold level pulses to pump a laser, thereby producing a train of laser pulses after threshold is achieved.

U.S. Pat. No. 3,172,056 issued on Mar. 2, 1965 to Stitch teaches the use of dual flash tubes to provide the optical pumping of a solid state laser. The first of the two flash tubes is used to raise the energy level of the laser material to just below threshold, the level required for oscillation (Stitch terms this "cocking" the laser). The second flash tube is used to trigger oscillation.

U.S. Pat. No. 3,341,787 issued on Sept. 12, 1967 to Biard et al teaches the use of a light emitting semiconductor diode to pump a solid state laser.

U.S. Pat. No. 3,624,545 issued on Nov. 30, 1971 to Ross teaches the use of a semiconductor laser diode to pump a solid state laser using pulse burst pumping.

SUMMARY OF THE INVENTION

The present invention is an improvement over the prior art in that it provides a laser that can be controlled to produce well shaped pulses of arbitrary duration and adjustable power. These results are achieved through precise control of the inversion level in the solid state laser material as a function of time. In the preferred embodiment of the present invention, a solid state lasing element, preferably in the form of a cylindrical rod, is circularly enclosed within a plurality of linear arrays of semiconductor lasers. The semiconductor arrays are driven by a controllable current source in such a way, to be explained in detail hereinafter, as to effectively control the population inversion in the solid state laser. When the above described apparatus is arranged with suitable reflective surfaces, it will function as a controllable pulse oscillator. In the laser oscillator embodiment, control of the inversion population is achieved by means of a novel method of pumping. The pump is applied for a brief period, to raise the inversion population over threshold, and is then turned off until oscillation starts. The pump is then applied again for the desired duration of the output. When the apparatus is arranged without reflective surfaces, it will function as an amplifier exhibiting linear amplification. Pump control in the amplifier embodiment uses a prepump interval to establish the desired inversion population.

It is a principle object of the present invention to provide improved control of the output of a pulse laser oscillator.

Another object of the invention is to provide means for linear amplification of pulse laser signals.

Yet another object of the invention is to provide means to produce a generally rectangular shaped laser pulse output from a laser oscillator.

A further object of the invention is to provide means to control the duration of the output of a pulse laser oscillator.

A still further object of the invention is to provide a means to control the power level of a pulse laser oscillator output.

Another object of the invention is to provide means to maintain a relatively constant power throughout the duration of the output of a pulse laser oscillator.

Yet another object of the invention is to provide means to produce generally rectangular laser pulses of relatively long duration.

Other objects and advantages of the present invention will be apparent from the following description when taken with the drawings.

DETAILED DESCRIPTION OF A PREFERRED EMBODIMENT

The advantages of the present invention over the prior art can be best understood after consideration of FIG. 1. In FIG. 1a, there is illustrated the population inversion as a function of time for a typical solid state laser oscillator in which the pump power is just sufficient to exceed the threshold for oscillation. Population inversion, N, is defined as the difference between the population of the upper quantum state, $N_2$, and the population in the lower quantum state, $N_1$, that is:

$$N = N_2 - N_1$$

Figure 1A:
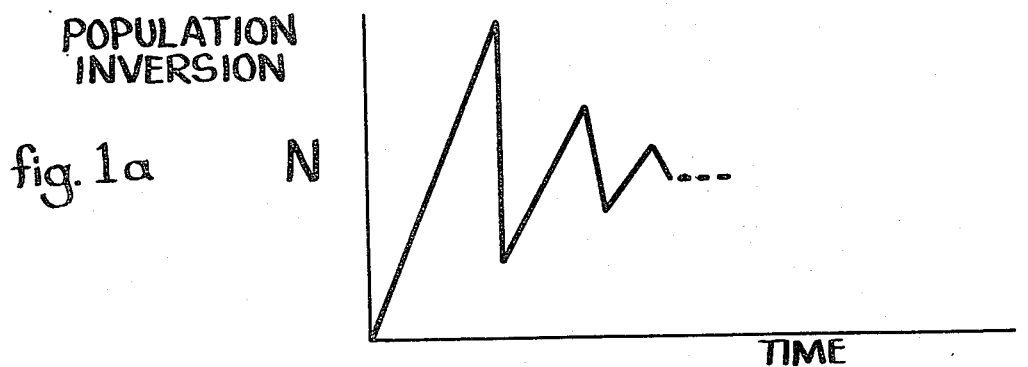
FIGS. 1a through 1d are graphical illustrations of the population inversion and laser power out for typical solid state lasers under various pump conditions.
Figure 1B:
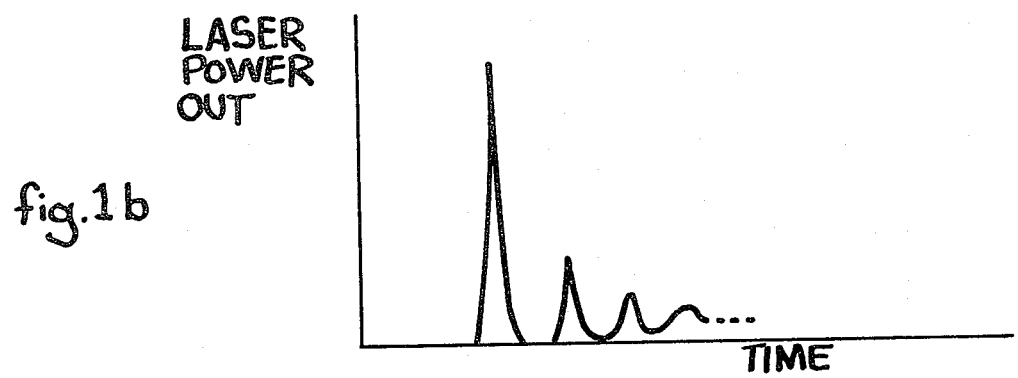
Figure 1C:
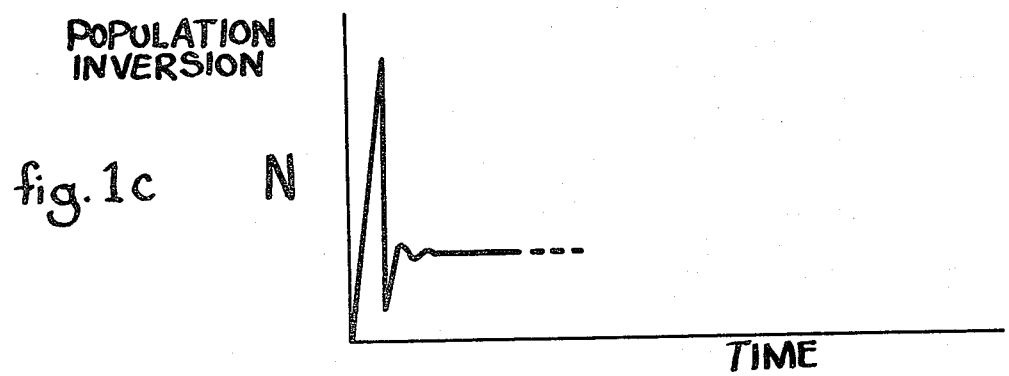
Figure 1D:
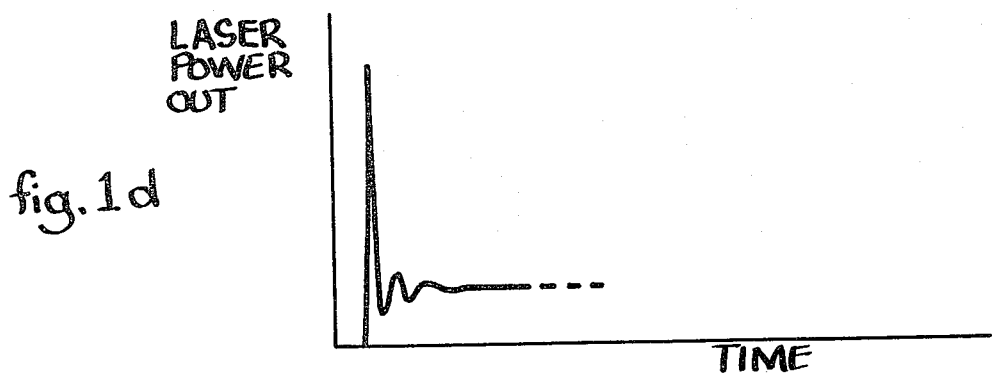

In a laser oscillator, solid state or otherwise, the pump energy causes the affected structures, ions, electronics, etc., to be raised to the upper quantum state. There may be a two step process involved in moving the affected structures into the upper state, as in the four level laser, as is well known in the art. The essential factor is that the upper state achieves a population, $N_2$, greater than the lower state by an amount equal to or greater than the inversion threshold for lasing to occur. As can be seen in FIG. 1a, pumping a typical solid state laser oscillator, using an ideal waveform (not shown), to just above the threshold value results in a ragged, sawtooth shape in the population inversion. This results in the spiked type of laser oscillator output shown in FIG. 1b. If the pump power is large enough to exceed greatly the threshold, the population inversion typically appears as is shown in FIG. 1c. In FIG. 1c, the population inversion rises rapidly to a large value. When lasing occurs, the population falls rapidly and rings before stabilizing. The output envelope waveform exhibits a large leading edge spike followed by ringing as shown in FIG. 1d. The outputs depicted in FIG. 1b and FIG. 1d, although typical, are detrimental to many uses of laser oscillators. As will be seen herein, the present invention provides means to produce laser outputs that have far more useful waveforms.

Figure 2:
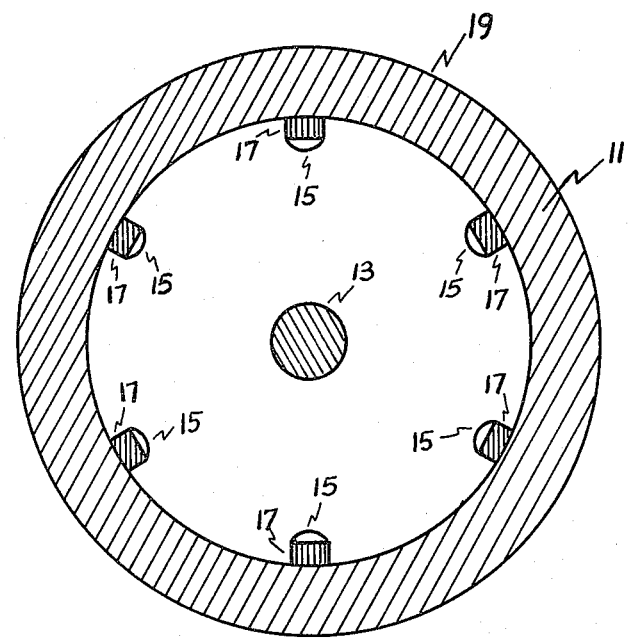
FIG. 2 is a cross-sectional view of one embodiment of a laser assembly of the present invention.

FIG. 2 shows a cross-section of the preferred embodiment of the laser assembly 19 of the present invention. FIG. 2, taken in conjunction with FIG. 3, a perspective cut-away view of the laser assembly, and FIG. 4, a longitudinal cross-section, discloses the structure of laser assembly 19. Laser assembly housing 11, as shown in FIG. 2, supports at least one semi-conductor array, referred to herein as laser diode array 17, preferably arranged circularly around solid state lasing element 13, shown as an elongated rod having a circular cross-section for purposes of illustration. In the preferred embodiment of the present invention, laser assembly 19 contains a plurality of laser diode arrays 17; however, as an alternative, having utility in certain low power applications, it is within the scope of the present invention to provide a single array 17.

In the preferred embodiment of the present invention, solid state lasing element 13 is neodymium doped yttrium aluminum garnet (Nd:YAG) rod. In Nd:YAG the emitting state, $4F_{3/2}$, emits at a wavelength of 1.0641 micrometers. Other solid state lasing materials, such as ruby, can be used without departing from the intent of the present invention.

Means for focusing the outputs of laser diode arrays on solid state lasing element 13 are provided. Said means 15 for focusing the laser diode array 17 outputs will preferably take the form of lenses 15; one alternative embodiment is to shape the laser diode junctions to achieve the focusing. From FIG. 3, the arrangement of laser diode arrays 17 and solid state lasing element 13 can be better understood.

Figure 4:
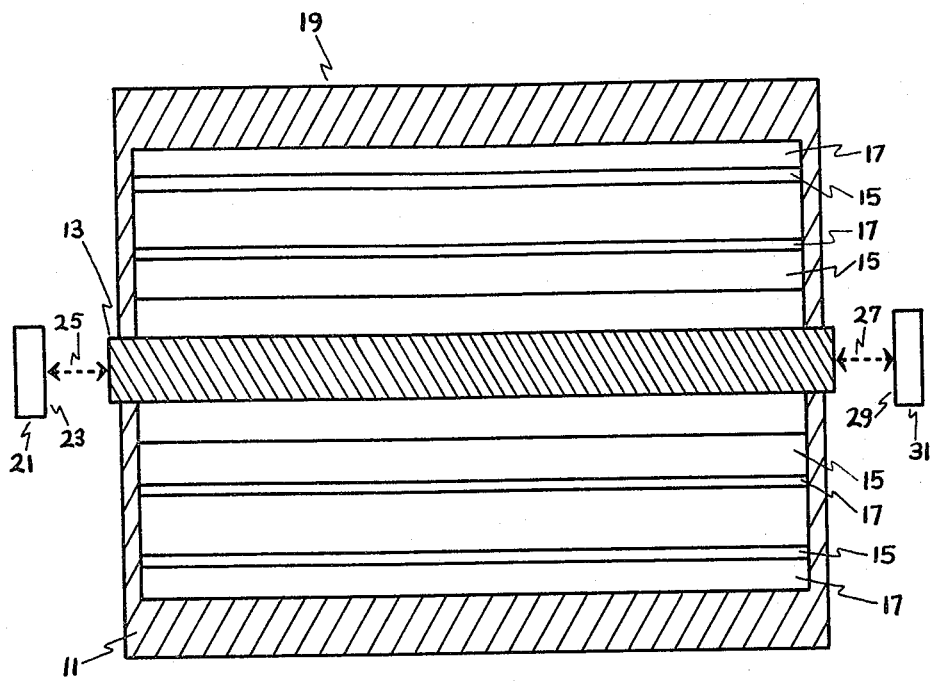
FIG. 4 is a longitudinal cross-section of the laser assembly of FIG. 3 including reflective surfaces.

As shown in FIG. 4, housing 11 also supports the ends of solid state lasing element 13. Laser assembly 19, comprising housing 11, solid state lasing element 13, laser diode arrays 17, and focusing means 15, taken together, provide the laser structure required for laser amplification. When laser assembly 19 is used in combination with reflective means 21 and partially reflective means 31, the structure required for a solid state laser oscillator is achieved. As used herein, a laser oscillator is a device for producing coherent radiation. Reflectance means 21, preferably a mirror substrate, is provided with a highly reflective surface 23. The reflectivity of surface 23 should be such that essentially all light incident upon it is reflected. It is well known in the art to construct such reflective surfaces. Partially reflective means 31 is provided with a partially reflective surface 29. The purpose of partially reflecive means 31 is to reflect a portion of the light incident upon it and to allow the unreflected portion of the incident light to be passed through partially reflective means 31 with substantially no loss. Normally, the amount of incident light reflected by partially reflective means 31 is approximately fifty percent with the remaining fifty percent transmitted. This one-to-one ratio of reflected-to-transmitted light can be varied without departing from the intent of the present invention. Surfaces 23 and 29 are spaced with respect to the ends of solid state lasing element 13 as indicated by distances 25 and 27 such as to create a resonant cavity that supports laser oscillation (i.e., the production of coherent radiation) in the desired mode. The art of providing a laser oscillator using a resonant cavity formed by spacing reflective surfaces, with a lasing element disposed within the resonant cavity, is well known (see page 34 of "An Introduction to Lasers and Masers" by Siegman, McGraw-Hill, 1971). Thus, solid state laser assembly 19, in combination with reflective means 21 and partially reflective means 31, form a solid state laser oscillator means.

Means for cooling the laser diode arrays 17 must, in general, be provided to maintain the arrays 17 at the desired operating temperature. There are methods for controlling the temperature of laser devices that are well known in the art. For example, laser assembly 19 can be enclosed in a heat sink shield that is provided with channels for flowing a cooled liquid through the heat sink to transfer the heat away from laser assembly 19. Any of several known means for controlling the temperature of the array 17 can be used without departing from the intent of the present invention. When maintained at the desired temperature, the wavelength and bandwidth of the output of the laser diode arrays 17 are matched to a strong absorption line of neodymium that couples to the $4F_{3/2}$ level with essentially unity quantum efficiency. In the preferred embodiment of the present invention, the temperature of desired operation is essentially "room temperature" or about 20° C. Operation at other temperatures is within the intent and scope of the present invention, and the temperatures are generally established by the choice of lasing material used, the wavelength of operation, and other design factors.

The light output of the laser diode arrays 17, referred to in the art as the optical pump or, more simply, the pump, is optically coupled to the solid state lasing element 13 by focusing means 15 such that essentially all of the light output of the pump, referred to herein as the pump power, is absorbed by the solid state lasing element 13. This, in conjunction with the essentially unity quantum coupling efficiency, leads to high efficiency in the present invention.

Figure 5A:
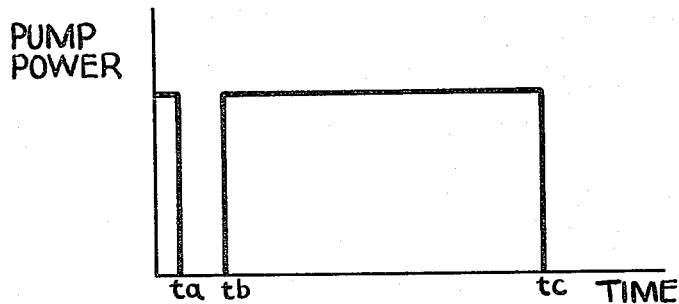
FIGS. 5a through 5c are graphical illustrations of the pump power, population inversion, and laser output of the laser of FIGS. 2 through 4 functioning as an oscillator.
Figure 5B:
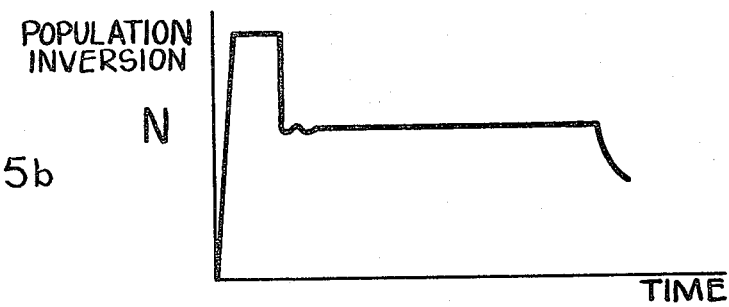
Figure 5C:
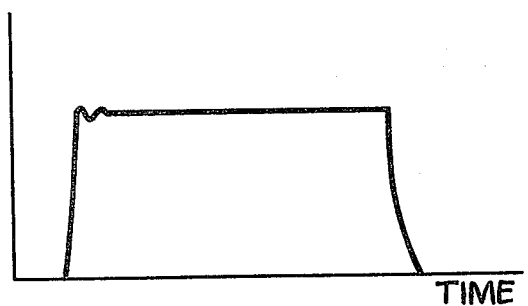

FIG. 5a depicts the preferred time waveform of the pump power used in the oscillator embodiment of the present invention. Pump power is applied to solid state lasing element 13 at a predetermined power level for a time sufficient to cause the population inversion to grow to an excess over threshold. In FIG. 5a, this time is denoted $t_a$ and is generally in the order of 30 to 40 nanoseconds. The growth of the population inversion that results from this pumping is shown in FIG. 5b. At time $t_a$, the pump is cut off, as shown in FIG. 5a. Due to the population inversion, the power in the laser resonant cavity, formed by reflective means 21, partially reflective means 31, and lasing element 13, as shown in FIG. 4, grows to the point that oscillation begins. When oscillation begins, the population inversion drops towards the threshold. For given conditions, e.g., rod material, pump rate (i.e., the power level of the pump), round-trip transit of time of light in the resonant cavity, etc., timing for the hereinabove described action can be determined by methods well known in the art. As the declining population inversion reaches threshold, the pump is again turned on to the same pump rate (i.e., predetermined power level) as was used in the initial pump terminating at time $t_a$. The time at which the pump is restarted is denoted $t_b$ in FIG. 5b. In the preferred embodiment, the difference $t_b$ minus $t_a$ is in the order of 160 nanoseconds. By pumping as shown in FIG. 5a, the population inversion changes with time as shown in FIG. 5b and results in a laser output having the waveform shown in FIG. 5c. When the waveform of FIG. 5c is compared with the waveform of FIG. 1d, it is apparent that the initial spike has been suppressed and that the produced wave shape is generally rectangular in shape, with essentially constant power over the pulse duration. Further, by pumping the laser oscillator as disclosed in FIG. 4, a high degree of coherence and directionality is established by the time the oscillation has reached its steady state power. The duration of the pumping from $t_b$ to the termination of pumping, denoted $t_c$ in FIG. 5a, directly controls the duration of the laser output. The power in the laser output is controlled by the pump power (up to the saturation limit of lasing element 13). The timing factors, i.e., the value of $t_a$ and $t_b$, and the pump rate, are functionally related to the inversion lifetime of the material used in the laser rod, the round trip transit time in the oscillation resonant cavity, and the desired laser power output, among other factors. The methods required to determine the values of $t_a$ and $t_b$ can be determined by one skilled in the art using known relationships (see "An Introduction to Lasers and Masers" by A. E. Sigeman, McGraw-Hill, 1971 and "Principles of Quantum Electronics" by W. S. C. Chang, Addison Wesley, 1969) in conjunction with experimental adjustment to optimize pump power, $t_a$, and $t_b$ minus $t_a$. In summary, the value of $t_a$ is that determined to raise the population inversion to the desired level at the pump rate selected. The pumping rate is set by the desired power level and is approximately $$R_p = nS_o/T$$

where $R_p$ is the pumping rate in photons per second, n is the desired energy level in photons, $S_o$ is the output coupling, and T is the round trip transit time of light in the resonant cavity in seconds. The value of $t_b$ is established by the rate of power buildup in the resonant cavity. Thus, the power output predetermines the pump power.

An alternative embodiment in which the pump power is diminished to low level during the interval between $t_a$ and $t_b$ rather than to zero power is within the scope of the present invention. Suitable adjustment of the pump power in the interval of time $t_a$, the value of $t_a$, and the duration of $t_b$ minus $t_a$ are required in this alternative embodiment.

Figure 3:
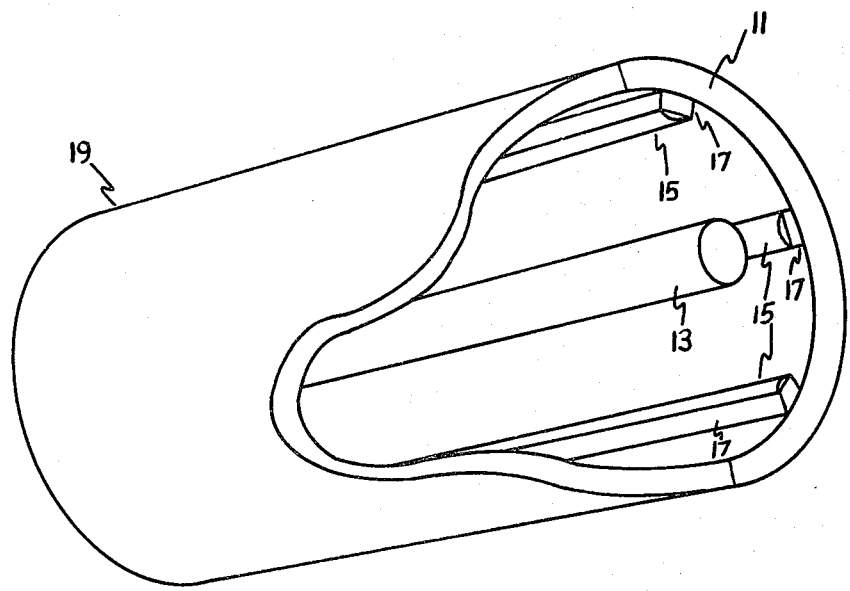
FIG. 3 is a partially cut-away, perspective view of the laser assembly of FIG. 2.
Figure 6A:
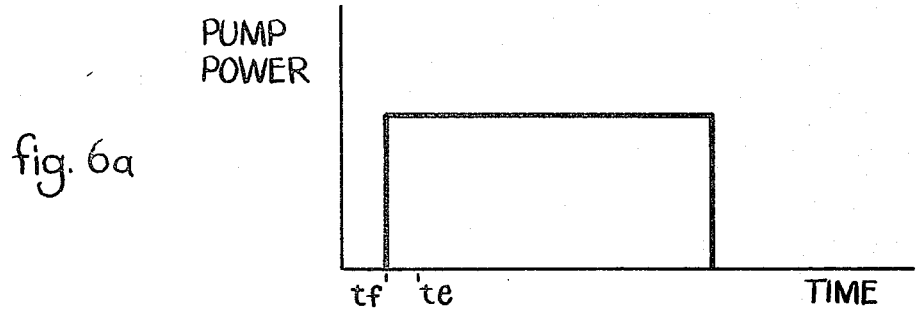
FIGS. 6a through 6c are graphical illustrations of the pump power, population inversion, and laser output of the laser of FIGS. 2 through 4 functioning as an amplifier.
Figure 6B:
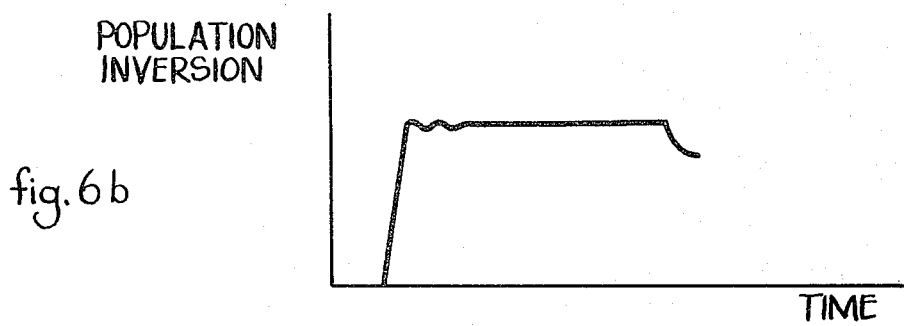
Figure 6C:
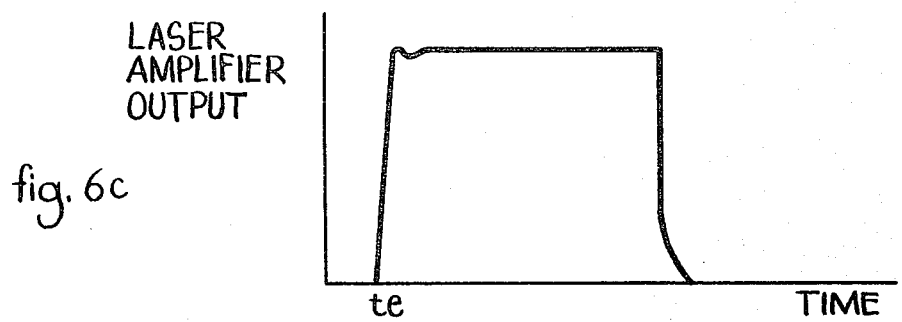

Proper control of the pump power applied to lasing element 13 allows laser assembly 19, as shown in FIG. 3, to function as a linear amplifier. To function as an amplifier, laser assembly 19 is aligned such that laser pulses to be amplified are applied to one end of lasing element 13. For example, if a laser pulse to be amplified is timed to arrive at time $t_e$ as shown in FIG. 6a, the pump is started at time $t_f$. The difference $t_e$ minus $t_f$ is termed the prepump interval and is typically in the order of 60 nanoseconds. The prepump interval, in which pump power is coupled to the lasing element 13 at a predetermined level, causes the population inversion to rise to the level required to support the desired amplification in steady state as shown in FIG. 6b. The output from the amplifier is available at the opposite end of lasing element 13 from that at which the input pulse was applied and is an amplified replica of the input pulse as shown in FIG. 6c. The predetermined level of the pump power is established by the desired power gain among other known factors.

Semiconductor laser diode arrays are used in the preferred embodiment in the present invention. However, in view of the material disclosed herein, it will be apparent to one skilled in the art that any pump providing pump power of predetermined constant power and of adjustable duration is within the scope and intent of this invention.

A plurality of laser diode arrays 17 form the optical pump in the preferred embodiment as shown in FIG. 3. Each array 17 contains a plurality of individual injection laser diodes connected in series. Such arrays are known in the art and can be fabricated by known techniques.

Figure 7A:
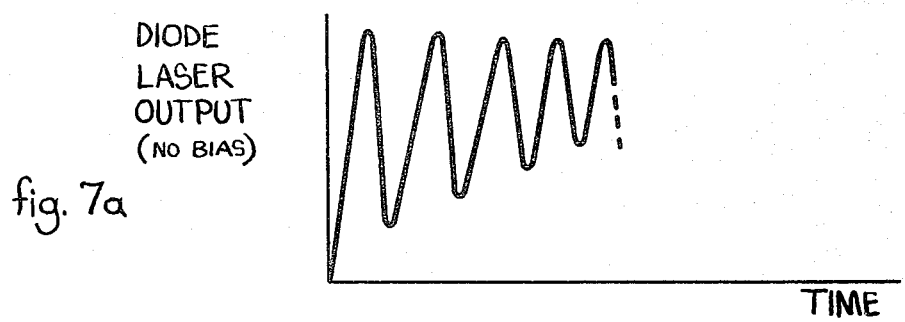
FIGS. 7a and 7b are graphical illustrations of the output of a diode laser without and with bias.
Figure 7B:
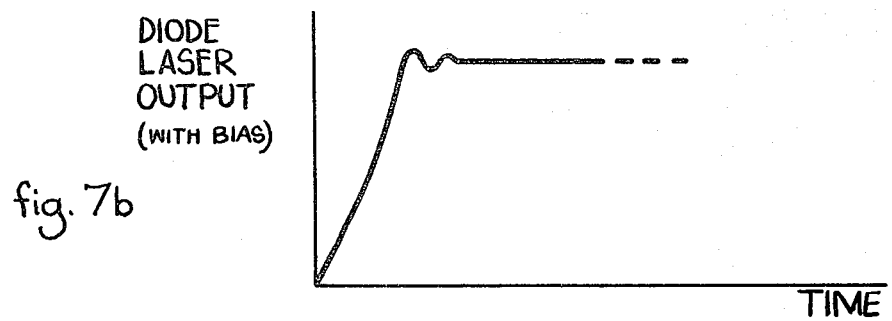

FIG. 7a depicts the waveform of the output power of an unbiased diode laser when actuated by a current pulse whose amplitude exceeds the diode's threshold for lasing. The relaxation oscillations shown in FIG. 7a will damp out in time. This waveform does not provide the controlled pump power required in the present invention. However, by providing a direct current bias that approximately equals the threshold current of the diode laser, the oscillations in the output can be suppressed. FIG. 7b shows the output of a diode laser driven by a pulse of current superimposed on a bias current that approximately raises the diode to its threshold. Biased laser diodes provide the preferred means to produce the pump waveforms required by the present invention; other means to provide laser diode pumping with controlled power level can be used without departing from the intent of the present invention. Rise times in the order of one nanosecond can be achieved using laser diodes; fall times are of the same order of magnitude. The pump power output of a laser diode is directly proportional to the current drive allowing direct control of the pump power.

Figure 8:
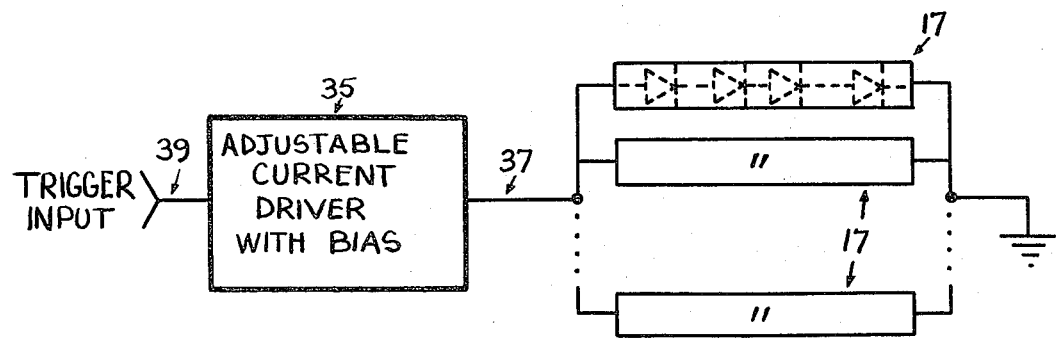
FIG. 8 is a block diagram showing the laser semiconductor pump of the present invention.

FIG. 8 is a schematic diagram of the pumping means used in the preferred embodiment of the present invention. A plurality of laser diode arrays 17 are connected in parallel as shown. Each array 17 contains a plurality of individual injection laser diodes connected in series. Driver 35 is connected to the parallel arrangement of arrays 17 by conductor 37. Driver 35 provides a steady state direct current bias to arrays 17 to maintain the laser diodes at threshold. A trigger input, in the form of a voltage signal, applied to conductor 39 causes driver 35 to produce a current pulse output superimposed on the bias current on conductor 37. The duration of the current pulse produced by driver 35 is controlled by the duration of the trigger input. The amplitude of the current pulse is set by adjustment of driver 35. The detailed design of driver 35 can take any of several conventional forms of current pulse generators known in the art.

Figure 9:
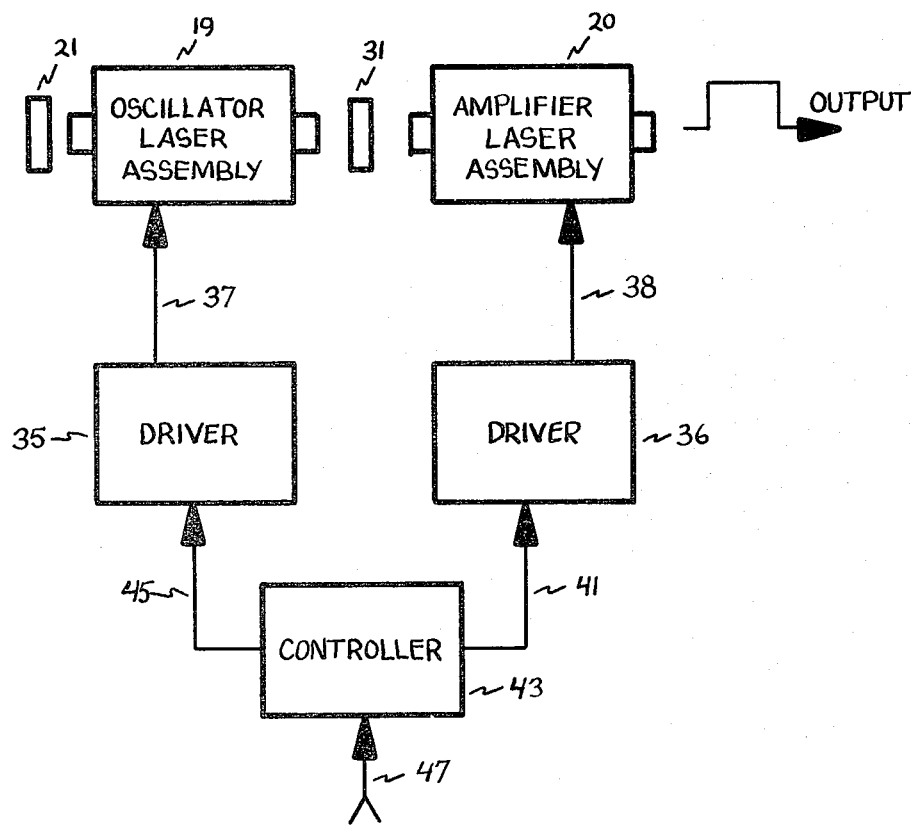
FIG. 9 is a block diagram of the oscillator and one stage of amplification.

FIG. 9 shows a block diagram of the present invention applied to the generation and amplification of a rectangular laser pulse. Two laser assemblies are shown, one assembly 19 is used in combination with reflective means 21 and partially reflective means 31 to form a laser oscillator as disclosed hereinabove and the other laser assembly 20 is used as an amplifier as indicated. The operation of the apparatus depicted in FIG. 9 can be understood from the following description.

To produce a laser pulse output, a control signal is applied to conductor 47. Said control signal on conductor 47 causes controller 43 to produce a trigger signal on conductor 45 having a time waveform that is a replica of the pump power waveform shown in FIG. 5a (e.g., the signal is present for $t_a$ seconds, returns to zero, and then is present from time $t_b$ to time $t_c$). Driver 35, responsive to the trigger signal on conductor 45, produces current pulses on conductor 37 thereby causing the diode arrays contained in laser assembly 19 to produce pump power as shown in FIG. 5a. This action causes the production of a laser pulse that is emitted through partially reflective means 31 and is thereby coupled to amplifier laser assembly 20. Responsive to the control signal on conductor 47, controller 43 also produces a trigger signal on conductor 41. The trigger signal on conductor 41 is a replica of the time waveform of pump power shown in FIG. 6a. The start of the prepump interval $t_f$ is set such that it precedes the laser pulse produced by laser assembly 19 in conjunction with reflective means 21 and partially reflective means 31 by approximately 60 nanoseconds. Responsive to the trigger signal on conductor 41, driver 36 produces the required current pulse on conductor 38 to pump laser assembly 20 as shown in FIG. 6a, thereby amplifying the laser pulse. Controller 43 is of conventional design and can be embodied in any one of several ways well known in the art to produce voltage signals of predetermined timing in response to a control signal.

While the present invention has been shown and described with reference to preferred embodiments thereof, it will be understood by those skilled in the art that changes in form and details may be made therein without departing from the intent and scope of the invention. Accordingly, it is understood that the invention is to be broadly construed within the spirit and scope of the appended claims.

What is claimed is:

1. A laser comprising
   a solid state lasing element;
   means for extracting energy from said lasing element;
   pumping means optically coupled to said solid state lasing element;
   means for causing said pumping means to apply pump power to said solid state lasing element at a predetermined power level for a time sufficient to cause the population inversion to grow to an excess over threshold;
   means for diminishing said pump power to a lower level after a predetermined time interval $t_a$; and
   means for increasing said pump power at a time $t_b$ when the declining population inversion reaches threshold.

2. The laser of claim 1 wherein
   said solid state lasing element is a circular, elongated rod of neodymium doped yttrium aluminum garnet.

3. The laser of claim 1 wherein
   said pumping means includes at least one laser diode array comprising a plurality of semiconductor lasers connected in series.

4. The laser of claim 3 wherein
   said pumping means includes a driver providing a current bias to maintain said laser diode array approximately at threshold.

5. The laser of claim 1 wherein said means for diminishing and increasing said pump power comprises
   a driver; and
   a control signal source coupled to said driver.

6. A method for operating a laser comprising a solid state lasing element disposed within a resonant cavity, said resonant cavity including means for extracting energy, and pumping means optically coupled to said lasing element, the steps consisting of
   pumping said lasing element at a predetermined power level for a first time interval, $t_a$;
   diminishing said power level for a second time interval, $t_b$ minus $t_a$;
   increasing said power level for a third time interval, $t_c$ minus $t_b$, whereby said lasing element is raised above the lasing threshold in said first time interval, $t_a$, begins oscillation in said second time interval, $t_b$ minus $t_a$, and thereby produces an output pulse of substantially constant power for the duration of said third time interval, $t_c$ minus $t_b$.

7. A method for operating a laser amplifier comprising a solid state lasing element, means for extracting energy from said lasing element and pumping means optically coupled to said lasing element, the steps consisting of
   pumping said lasing element at a predetermined power level for a time interval, $t_e$ minus $t_f$, prior to the application of a laser pulse input;
   applying a laser pulse input at time $t_e$; and pumping said lasing element at said predetermined power level for the duration of said pulse laser input signal.

8. A laser oscillator comprising a solid state lasing element disposed within a resonant cavity;

means for extracting energy from said resonant cavity;

pumping means optically coupled to said solid state lasing element whereby pump power produced by said pumping means is applied to said lasing element; and means for causing said pumping means to produce said pump power having a waveform consisting essentially of a period of predetermined constant power for a time interval of $t_a$, followed by a period of diminished power for a time interval of $t_b$ minus $t_a$ followed by a period of increased power for a time interval of $t_c$ minus $t_b$.

9. The laser oscillator of claim 8 wherein said power in said interval $t_b$ minus $t_a$ is reduced to zero.

10. The laser oscillator of claim 8 wherein said pumping means comprises a semiconductor laser array biased to lasing threshold.

11. A solid state laser comprising a solid state lasing element;

pumping means optically coupled to said solid state lasing element; and means for causing said pumping means to apply pump power to said solid state lasing element at a predetermined power level for a time interval, $t_e$ minus $t_f$, prior to the application of a laser pulse input;

means for applying a laser input at time $t_e$ and pumping said lasing element at said predetermined power level for the duration of said laser pulse input; and means for extracting energy from said lasing element.

* * * * *